United States Patent
Wong et al.

(10) Patent No.: US 9,799,662 B2
(45) Date of Patent: Oct. 24, 2017

(54) ANTIFUSE-TYPE ONE TIME PROGRAMMING MEMORY CELL AND ARRAY STRUCTURE WITH SAME

(71) Applicant: eMemory Technology Inc., Hsin-Chu (TW)

(72) Inventors: Wei-Zhe Wong, Hsinchu County (TW); Meng-Yi Wu, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 0 days.

(21) Appl. No.: 14/994,831

(22) Filed: Jan. 13, 2016

(65) Prior Publication Data
US 2017/0053926 A1    Feb. 23, 2017

Related U.S. Application Data

(60) Provisional application No. 62/206,828, filed on Aug. 18, 2015.

(51) Int. Cl.
*H01L 27/12* (2006.01)
*H01L 27/112* (2006.01)
(Continued)

(52) U.S. Cl.
CPC ........ H01L 27/11206 (2013.01); G11C 17/16 (2013.01); H01L 23/528 (2013.01);
(Continued)

(58) Field of Classification Search
CPC ........... H01L 27/11206; H01L 23/5226; H01L 23/5252; H01L 27/0207; H01L 23/528; G11C 17/16
See application file for complete search history.

(56) References Cited

U.S. PATENT DOCUMENTS 6,556,467 B2   4/2003   Derner et al.
6,700,151 B2   3/2004   Peng
(Continued)

FOREIGN PATENT DOCUMENTS

JP   2009503901   1/2009
JP   2011517067   5/2011
(Continued)

OTHER PUBLICATIONS

European Patent Office "European Search Report" issued on Dec. 22, 2016, EPO.
(Continued)

*Primary Examiner* — Earl Taylor
(74) *Attorney, Agent, or Firm* — WPAT, PC

(57) ABSTRACT

An antifuse-type OTP memory cell has following structures. A first doped region, a second doped region, a third doped region and a fourth doped region are formed in a well region. A gate oxide layer covers the surface of the well region. A first gate is formed on the gate oxide layer and spanned over the first doped region and the second doped region. The first gate is connected with a word line. A second gate is formed on the gate oxide layer and spanned over the second doped region and the third doped region. The second gate is connected with an antifuse control line. A third gate is formed on the gate oxide layer and spanned over the third doped region and the fourth doped region. The third gate is connected with an isolation control line.

3 Claims, 10 Drawing Sheets

(51) Int. Cl.
*G11C 17/16* (2006.01)
*H01L 23/522* (2006.01)
*H01L 23/525* (2006.01)
*H01L 23/528* (2006.01)
*H01L 27/02* (2006.01)

(52) U.S. Cl.
CPC ...... *H01L 23/5226* (2013.01); *H01L 23/5252* (2013.01); *H01L 27/0207* (2013.01)

(56) References Cited

U.S. PATENT DOCUMENTS

| | | | | |
|---|---|---|---|---|
| 6,839,263 | B2* | 1/2005 | Fricke | G11C 13/0004 257/E27.004 |
| 6,927,997 | B2 | 8/2005 | Lee et al. | |
| 8,933,492 | B2 | 1/2015 | Kurjanowicz | |
| 9,136,217 | B2 | 9/2015 | Schmitt et al. | |
| 2003/0206467 | A1* | 11/2003 | Peng | G11C 17/16 365/200 |
| 2004/0151024 | A1* | 8/2004 | Fricke | G11C 13/0004 365/177 |
| 2007/0030719 | A1* | 2/2007 | Hoefler | G11C 17/16 365/94 |
| 2007/0076463 | A1* | 4/2007 | Keshavarzi | G11C 17/146 365/96 |
| 2012/0039105 | A1 | 2/2012 | Torige | |
| 2012/0211841 | A1* | 8/2012 | Kurjanowicz | G11C 17/16 257/369 |
| 2013/0077377 | A1* | 3/2013 | Kim | G11C 17/08 365/104 |
| 2016/0141049 | A1* | 5/2016 | Song | G11C 17/16 365/51 |
| 2017/0053707 | A1* | 2/2017 | Liao | G11C 17/18 |
| 2017/0053708 | A1* | 2/2017 | Wong | G11C 17/18 |
| 2017/0053925 | A1* | 2/2017 | Wong | H01L 27/11206 |
| 2017/0053926 | A1* | 2/2017 | Wong | H01L 27/11206 |
| 2017/0054300 | A1* | 2/2017 | Shao | H02J 4/00 |

FOREIGN PATENT DOCUMENTS

| | | |
|---|---|---|
| JP | 2015076556 | 4/2015 |
| TW | 200713289 | 4/2007 |

OTHER PUBLICATIONS

European Patent Office "European Search Report" issued on Jan. 19, 2017, EPO.
Taiwan Patent Office "Office Action" dated Jun. 26, 2017, Taiwan.
Japan Patent Office "Office Action" dated Jul. 4, 2017, Japan.

* cited by examiner

US 9,799,662 B2

ANTIFUSE-TYPE ONE TIME PROGRAMMING MEMORY CELL AND ARRAY STRUCTURE WITH SAME

This application claims the benefit of U.S. provisional application Ser. No. 62/206,828, filed Aug. 18, 2015, the disclosure of which is incorporated by reference herein in its entirety.

FIELD OF THE INVENTION

The present invention relates to a non-volatile memory cell, and more particularly to an antifuse-type one time programming memory cell and an array structure with this memory cell.

BACKGROUND OF THE INVENTION

As is well known, a non-volatile memory is able to continuously retain data after the supplied power is interrupted. Generally, after the non-volatile memory leaves the factory, the user may program the non-volatile memory in order to record data into the non-volatile memory.

According to the number of times the non-volatile memory is programmed, the non-volatile memories may be classified into a multi-time programming memory (also referred as a MTP memory), a one time programming memory (also referred as an OTP memory) and a mask read only memory (also referred as a Mask ROM).

Generally, the MTP memory may be programmed many times, and the stored data of the MTP memory may be modified many times. On the contrary, the OTP memory may be programmed once. After the OTP memory is programmed, the stored data fails to be modified. Moreover, after the Mask ROM leaves the factory, all stored data have been recorded therein. The user is only able to read the stored data from the Mask ROM, but is unable to program the Mask ROM.

Moreover, depending on the characteristics, the OTP memories may be classified into two types, i.e. a fuse-type OTP memory and an antifuse-type OTP memory. Before a memory cell of the fuse-type OTP memory is programmed, the memory cell has a low-resistance storing state. After the memory cell of the fuse-type OTP memory is programmed, the memory cell has a high-resistance storing state.

On the other hand, the memory cell of the antifuse-type OTP memory has the high-resistance storing state before being programmed, and the memory cell of the antifuse-type OTP memory has the low-resistance storing state after being programmed.

With increasing advance of the semiconductor manufacturing process, the process of manufacturing the OTP memory is compatible with the CMOS semiconductor manufacturing process. Since the CMOS semiconductor manufacturing process is continuously in progress, there is a need of providing an improved structure of an OTP memory in order to achieve more reliable performance of the OTP memory.

SUMMARY OF THE INVENTION

A first embodiment of the present invention provides an antifuse-type OTP memory cell. The antifuse-type OTP memory cell includes a well region, a first doped region, a second doped region, a third doped region, a fourth doped region, a gate oxide layer, a first gate, a second gate, a third gate and a first metal layer. The first doped region, the second doped region, the third doped region and the fourth doped region are formed in a surface of the well region. The gate oxide layer covers the surface of the well region. The first gate is formed on the gate oxide layer and spanned over the first doped region and the second doped region, wherein the first gate is connected with a word line. The second gate is formed on the gate oxide layer and spanned over the second doped region and the third doped region, wherein the second gate is connected with an antifuse control line. The third gate is formed on the gate oxide layer and spanned over the third doped region and the fourth doped region, wherein the third gate is connected with an isolation control line. The first metal layer is connected with the first doped region through a via, wherein the first metal layer is a bit line.

A second embodiment of the present invention provides an antifuse-type OTP memory cell. The antifuse-type OTP memory cell includes a select transistor, an antifuse transistor and an isolation transistor. A first drain/source terminal of the select transistor is connected with a bit line. A gate terminal of the select transistor is connected with a word line. A first drain/source terminal of the antifuse transistor is connected with a second drain/source terminal of the select transistor. A gate terminal of the antifuse transistor is connected with an antifuse control line. A first drain/source terminal of the isolation transistor is connected with a second drain/source terminal of the antifuse transistor. A gate terminal of the isolation transistor is connected with an isolation control line.

A third embodiment of the present invention provides an array structure. The array structure is connected with a first bit line, a first word line, a second word line, a first antifuse control line, a second antifuse control line, a first isolation control line and a second isolation control line. The array structure includes a well region, a first doped region, a second doped region, a third doped region, a fourth doped region, a fifth doped region, a sixth doped region, a seventh doped region, a gate oxide layer, a first gate, a second gate, a third gate, a fourth gate, a fifth gate, a sixth gate and a first metal layer. The first doped region, the second doped region, the third doped region, the fourth doped region, the fifth doped region, the sixth doped region and the seventh doped region are formed in a surface of the well region. The gate oxide layer covers the surface of the well region. The first gate is formed on the gate oxide layer and spanned over the first doped region and the second doped region, wherein the first gate is connected with the first word line. The second gate is formed on the gate oxide layer and spanned over the second doped region and the third doped region, wherein the second gate is connected with the first antifuse control line. The third gate is formed on the gate oxide layer and spanned over the third doped region and the fourth doped region, wherein the third gate is connected with the first isolation control line. The fourth gate is formed on the gate oxide layer and spanned over the seventh doped region and the sixth doped region, wherein the fourth gate is connected with the second word line. The fifth gate is formed on the gate oxide layer and spanned over the sixth doped region and the fifth doped region, wherein the fifth gate is connected with the second antifuse control line. The sixth gate formed on the gate oxide layer and spanned over the fifth doped region and the fourth doped region, wherein the sixth gate is connected with the second isolation control line. The first metal layer is connected with the first doped region through a first via and connected with the seventh doped region through a second via, wherein the first metal layer is the first bit line.

A fourth embodiment of the present invention provides an array structure. The array structure is connected with a first bit line, a first word line, a second word line, a first antifuse control line, a second antifuse control line, a first isolation control line and a second isolation control line. The array structure includes a first memory cell and a second memory cell. The first memory cell includes a first select transistor, a first antifuse transistor and a first isolation transistor. A first drain/source terminal of the first select transistor is connected with the first bit line. A gate terminal of the first select transistor is connected with the first word line. A first drain/source terminal of the first antifuse transistor is connected with a second drain/source terminal of the first select transistor. A gate terminal of the first antifuse transistor is connected with the first antifuse control line. A first drain/source terminal of the first isolation transistor is connected with a second drain/source terminal of the first antifuse transistor. A gate terminal of the first isolation transistor is connected with the first isolation control line. The second memory cell includes a second select transistor, a second antifuse transistor and a second isolation transistor. A first drain/source terminal of the second select transistor is connected with the first bit line. A gate terminal of the second select transistor is connected with the second word line. A first drain/source terminal of the second antifuse transistor is connected with a second drain/source terminal of the second select transistor. A gate terminal of the second antifuse transistor is connected with the second antifuse control line. A first drain/source terminal of the second isolation transistor is connected with a second drain/source terminal of the second antifuse transistor. A gate terminal of the second isolation transistor is connected with the second isolation control line. A second drain/source terminal of the first isolation transistor of the first memory cell is connected with a second drain/source terminal of the second isolation transistor of the second memory cell.

A fifth embodiment of the present invention provides an antifuse-type OTP memory cell. The antifuse-type OTP memory cell includes a well region, a first doped region, a second doped region, a third doped region, a gate oxide layer, a first gate, a second gate, a third gate and a first metal layer. The first doped region, the second doped region and the third doped region are formed in a surface of the well region. The gate oxide layer covers the surface of the well region. The first gate is formed on the gate oxide layer and spanned over the first doped region and the second doped region, wherein the first gate is connected with a word line. The second gate is formed on the gate oxide layer and spanned over the second doped region and the third doped region, wherein the second gate is connected with an antifuse control line. The third gate is formed on the gate oxide layer and spanned over the third doped region and a fourth doped region, wherein the third gate is connected with an isolation control line. The first metal layer is connected with the first doped region through a via, wherein the first metal layer is a bit line. The fourth doped region is included in another antifuse-type OTP memory cell that is adjacent to the antifuse-type OTP memory cell.

A sixth embodiment of the present invention provides an antifuse-type OTP memory cell. The antifuse-type OTP memory cell includes a select transistor, an antifuse transistor and an isolation transistor. A first drain/source terminal of the select transistor is connected with a bit line. A gate terminal of the select transistor is connected with a word line. A first drain/source terminal of the antifuse transistor is connected with a second drain/source terminal of the select transistor. A gate terminal of the antifuse transistor is connected with an antifuse control line. A first drain/source terminal of the isolation transistor is connected with a second drain/source terminal of the antifuse transistor. A gate terminal of the isolation transistor is connected with an isolation control line. A second drain/source terminal of the isolation transistor is included in another antifuse-type OTP memory cell that is adjacent to the antifuse-type OTP memory cell.

A seventh embodiment of the present invention provides an array structure. The array structure is connected with a first bit line, a first word line, a second word line, a first antifuse control line, a second antifuse control line and a first isolation control line. The array structure includes a well region, a first doped region, a second doped region, a third doped region, a fourth doped region, a fifth doped region, a sixth doped region, a gate oxide layer, a first gate, a second gate, a third gate, a fourth gate, a fifth gate and a first metal layer. The first doped region, the second doped region, the third doped region, the fourth doped region, the fifth doped region and the sixth doped region are formed in a surface of the well region. The gate oxide layer covers the surface of the well region. The first gate is formed on the gate oxide layer and spanned over the first doped region and the second doped region, wherein the first gate is connected with the first word line. The second gate is formed on the gate oxide layer and spanned over the second doped region and the third doped region, wherein the second gate is connected with the first antifuse control line. The third gate is formed on the gate oxide layer and spanned over the third doped region and the fourth doped region, wherein the third gate is connected with the first isolation control line. The fourth gate is formed on the gate oxide layer and spanned over the sixth doped region and the fifth doped region, wherein the fourth gate is connected with the second word line. The fifth gate is formed on the gate oxide layer and spanned over the fifth doped region and the fourth doped region, wherein the fifth gate is connected with the second antifuse control line. The first metal layer is connected with the first doped region through a first via and connected with the sixth doped region through a second via, wherein the first metal layer is the first bit line.

An eighth embodiment of the present invention provides an array structure. The array structure is connected with a first bit line, a first word line, a second word line, a first antifuse control line, a second antifuse control line and a first isolation control line. The array structure includes a first memory cell and a second memory cell. The first memory cell includes a first select transistor, a first antifuse transistor and a first isolation transistor. A first drain/source terminal of the first select transistor is connected with the first bit line. A gate terminal of the first select transistor is connected with the first word line. A first drain/source terminal of the first antifuse transistor is connected with a second drain/source terminal of the first select transistor. A gate terminal of the first antifuse transistor is connected with the first antifuse control line. A first drain/source terminal of the first isolation transistor is connected with a second drain/source terminal of the first antifuse transistor. A gate terminal of the first isolation transistor is connected with the first isolation control line. The second memory cell includes a second select transistor, a second antifuse transistor and the first isolation transistor. A first drain/source terminal of the second select transistor is connected with the first bit line. A gate terminal of the second select transistor is connected with the second word line. A first drain/source terminal of the second antifuse transistor is connected with a second drain/source terminal of the second select transistor. A gate terminal of the second antifuse transistor is connected with the second antifuse control line. A second drain/source terminal of the first isolation transistor is connected with a second drain/source terminal of the second antifuse transistor.

A ninth embodiment of the present invention provides an antifuse-type OTP memory cell. The antifuse-type OTP memory cell includes a well region, a first doped region, a second doped region, a third doped region, a gate oxide layer, a first gate, a second gate and a first metal layer. The first doped region, the second doped region and the third doped region are formed in a surface of the well region. The gate oxide layer covers the surface of the well region. The first gate is formed on the gate oxide layer and spanned over the first doped region and the second doped region, wherein the first gate is connected with an antifuse control line. The second gate is formed on the gate oxide layer and spanned over the second doped region and the third doped region, wherein the second gate is connected with an isolation control line. The first metal layer is connected with the first doped region through a via, wherein the first metal layer is a bit line. The gate oxide layer under the first gate is divided into a first part and a second part. The first part is closer to the first doped region. The second part is closer to the second doped region. The first part is thicker than the second part.

A tenth embodiment of the present invention provides an antifuse-type OTP memory cell. The antifuse-type OTP memory cell includes an antifuse transistor and an isolation transistor. A first drain/source terminal of the antifuse transistor is connected with a bit line. A gate terminal of the antifuse transistor is connected with an antifuse control line. A first drain/source terminal of the isolation transistor is connected with a second drain/source terminal of the antifuse transistor. A gate terminal of the isolation transistor is connected with an isolation control line. A gate oxide layer at the gate terminal of the antifuse transistor is divided into a first part and a second part. The first part is closer to the first drain/source terminal of the antifuse transistor. The second part is closer to the second drain/source terminal of the antifuse transistor. The first part is thicker than the second part.

An eleventh embodiment of the present invention provides an array structure. The array structure is connected with a first bit line, a first antifuse control line, a first isolation control line and a second isolation control line. The array structure includes a well region, a first doped region, a second doped region, a third doped region, a fourth doped region, a fifth doped region, a gate oxide layer, a first gate, a second gate, a third gate, a fourth gate and a first metal layer. The first doped region, the second doped region, the third doped region, the fourth doped region and the fifth doped region are formed in a surface of the well region. The gate oxide layer covers the surface of the well region. The first gate is formed on the gate oxide layer and spanned over the first doped region and the second doped region, wherein the first gate is connected with the first antifuse control line. The second gate is formed on the gate oxide layer and spanned over the second doped region and the third doped region, wherein the second gate is connected with the first isolation control line. The third gate is formed on the gate oxide layer and spanned over the fifth doped region and the fourth doped region, wherein the third gate is connected with the second antifuse control line. The fourth gate is formed on the gate oxide layer and spanned over the fourth doped region and the third doped region, wherein the fourth gate is connected with the second isolation control line. The first metal layer is connected with the first doped region through a first via and connected with the fifth doped region through a second via, wherein the first metal layer is the first bit line. The gate oxide layer under the first gate is divided into a first part and a second part. The gate oxide layer under the third gate is divided into a third part and a fourth part. The first part is closer to the first doped region. The second part is closer to the second doped region. The third part is closer to the fifth doped region. The fourth part is closer to the fourth doped region. The first part is thicker than the second part. The third part is thicker than the fourth part.

A twelfth embodiment of the present invention provides an array structure. The array structure is connected with a first bit line, a first antifuse control line, a second antifuse control line, a first isolation control line and a second isolation control line. The array structure includes a first memory cell and a second memory cell. The first memory cell includes a first antifuse transistor and a first isolation transistor. A first drain/source terminal of the first antifuse transistor is connected with the first bit line. A gate terminal of the first antifuse transistor is connected with the first antifuse control line. A first drain/source terminal of the first isolation transistor is connected with a second drain/source terminal of the first antifuse transistor. A gate terminal of the first isolation transistor is connected with the first isolation control line. The second memory cell includes a second antifuse transistor and a second isolation transistor. A first drain/source terminal of the second antifuse transistor is connected with the first bit line. A gate terminal of the second antifuse transistor is connected with the second antifuse control line. A first drain/source terminal of the second isolation transistor is connected with a second drain/source terminal of the second antifuse transistor. A gate terminal of the second isolation transistor is connected with the second isolation control line. A second drain/source terminal of the first isolation transistor of the first memory cell is connected with a second drain/source terminal of the second isolation transistor of the second memory cell. A gate oxide layer at the gate terminal of the first antifuse transistor is divided into a first part and a second part. The gate oxide layer at the gate terminal of the second antifuse transistor is divided into a third part and a fourth part. The first part is closer to the first drain/source terminal of the first antifuse transistor. The second part is closer to the second drain/source terminal of the first antifuse transistor. The third part is closer to the first drain/source terminal of the second antifuse transistor. The fourth part is closer to the second drain/source terminal of the second antifuse transistor. The first part is thicker than the second part. The third part is thicker than the fourth part.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1A:
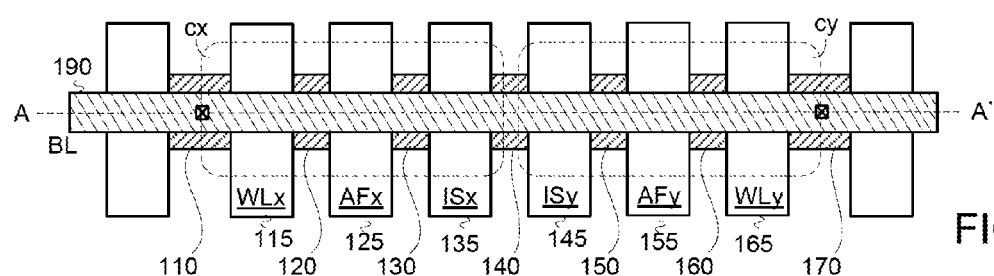
FIG. 1A is a schematic top view of an antifuse-type one time programming memory cell according to a first embodiment of the present invention.
Figure 1B:
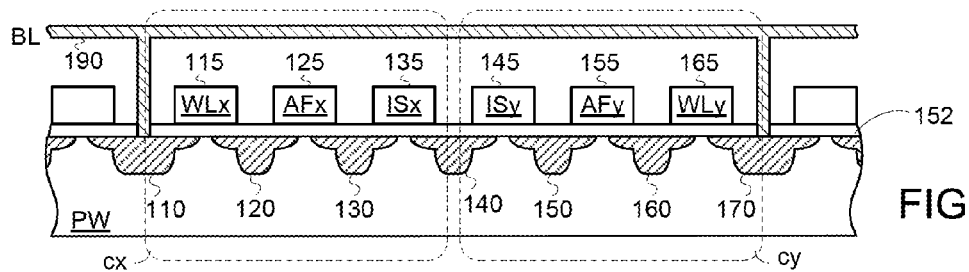
FIG. 1B is a schematic cross-sectional view of the antifuse-type one time programming memory cell of FIG. 1A and taken along a line AA'.
Figure 1C:
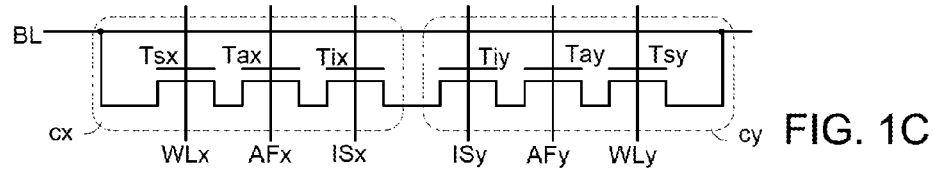
FIG. 1C is a schematic equivalent circuit diagram of the antifuse-type one time programming memory cell according to the first embodiment of the present invention.

FIG. 1A is a schematic top view of an antifuse-type one time programming memory cell according to a first embodiment of the present invention. FIG. 1B is a schematic cross-sectional view of the antifuse-type one time programming memory cell of FIG. 1A and taken along a line AA'. FIG. 1C is a schematic equivalent circuit diagram of the antifuse-type one time programming memory cell according to the first embodiment of the present invention. For brevity, the antifuse-type one time programming memory cell is also referred as an OTP memory cell.

As shown in FIGS. 1A and 1B, two OTP memory cells cx and cy are constructed in a P-well region PW. A first doped region 110, a second doped region 120, a third doped region 130, a fourth doped region 140, a fifth doped region 150, a sixth doped region 160 and a seventh doped region 170 are formed under a top surface of the P-well region PW. Moreover, a gate oxide layer 152 covers the top surface of the P-well region PW. In this embodiment, the seven doped regions 110, 120, 130, 140, 150, 160 and 170 are N-type doped regions.

The structure of the OTP memory cell cx will be described as follows. A first gate 115 is formed on the gate oxide layer 152 and spanned over the first doped region 110 and the second doped region 120. Moreover, the first gate 115 is connected with a word line WLx. A second gate 125 is formed on the gate oxide layer 152 and spanned over the second doped region 120 and the third doped region 130. The second gate 125 is connected with an antifuse control line AFx. A third gate 135 is formed on the gate oxide layer 152 and spanned over the third doped region 130 and the fourth doped region 140. The third gate 135 is connected with an isolation control line ISx.

The structure of the OTP memory cell cy will be described as follows. A fourth gate 165 is formed on the gate oxide layer 152 and spanned over the seventh doped region 170 and the sixth doped region 160. Moreover, the fourth gate 165 is connected with a word line WLy. A fifth gate 155 is formed on the gate oxide layer 152 and spanned over the sixth doped region 160 and the fifth doped region 150. The fifth gate 155 is connected with an antifuse control line AFy. A sixth gate 145 is formed on the gate oxide layer 152 and spanned over the fifth doped region 150 and the fourth doped region 140. The sixth gate 145 is connected with an isolation control line ISy.

A first metal layer 190 is disposed over the six gates 115, 125, 135, 145, 155 and 165. Moreover, the first metal layer 190 is connected with the first doped region 110 and the seventh doped region 170 through two vias. The first metal layer 190 is used as a bit line BL of the OTP memory cells cx and cy.

Please refer to FIG. 1C. The first doped region 110, the second doped region 120 and the first gate 115 are collaboratively formed as a select transistor Tsx of the OTP memory cell cx. The second doped region 120, the third doped region 130 and the second gate 125 are collaboratively formed as an antifuse transistor Tax of the OTP memory cell cx. The third doped region 130, the fourth doped region 140 and the third gate 135 are collaboratively formed as an isolation transistor Tix of the OTP memory cell cx. A first drain/source terminal of the select transistor Tsx is connected with the bit line BL. A gate terminal of the select transistor Tsx is connected with the word line WLx. A first drain/source terminal of the antifuse transistor Tax is connected with a second drain/source terminal of the select transistor Tsx. A gate terminal of the antifuse transistor Tax is connected with the antifuse control line AFx. A first drain/source terminal of the isolation transistor Tix is connected with a second drain/source terminal of the antifuse transistor Tax. A gate terminal of the isolation transistor Tix is connected with the isolation control line ISx.

The seventh doped region 170, the sixth doped region 160 and the fourth gate 165 are collaboratively formed as a select transistor Tsy of the OTP memory cell cy. The sixth doped region 160, the fifth doped region 150 and the fifth gate 155 are collaboratively formed as an antifuse transistor Tay of the OTP memory cell cy. The fifth doped region 150, the fourth doped region 140 and the sixth gate 145 are collaboratively formed as an isolation transistor Tiy of the OTP memory cell cy. A first drain/source terminal of the select transistor Tsy is connected with the bit line BL. A gate terminal of the select transistor Tsy is connected with the word line WLy. A first drain/source terminal of the antifuse transistor Tay is connected with a second drain/source terminal of the select transistor Tsy. A gate terminal of the antifuse transistor Tay is connected with the antifuse control line AFy. A first drain/source terminal of the isolation transistor Tiy is connected with a second drain/source terminal of the antifuse transistor Tay. A gate terminal of the isolation transistor Tiy is connected with the isolation control line ISy.

In this embodiment, a second drain/source terminal of the isolation transistor Tix of the OTP memory cell cx is connected with a second drain/source terminal of the isolation transistor Tiy of the OTP memory cell cy. In other words, two isolation transistors Tix and Tiy are serially connected between the second drain/source terminal of the antifuse transistor Tax of the OTP memory cell cx and the second drain/source terminal of the antifuse transistor Tay of the OTP memory cell cy. Under this circumstance, it is not necessary to form a shallow trench isolation structure in the P-well region to isolate the OTP memory cell cx from the OTP memory cell cy.

FIGS. 2A~2D schematically illustrate associated voltage signals for programming and reading the OTP memory cell according to the first embodiment of the present invention.

Figure 2A:
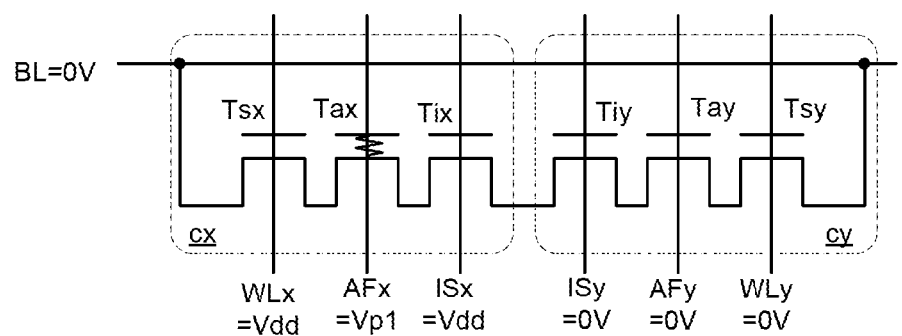
FIGS. 2A~2D schematically illustrate associated voltage signals for programming and reading the OTP memory cell according to the first embodiment of the present invention.

Please refer to FIG. 2A. For programming the OTP memory cell cx to a first storing state, a ground voltage (0V) is provided to the bit line BL, a select voltage Vdd is provided to the word line WLx, a first program voltage Vp1 is provided to the antifuse control line AFx, and the select voltage Vdd is provided to the isolation control line ISx. In addition, the ground voltage (0V) is provided to the word line WLy, the antifuse control line AFy and the isolation control line ISy of the OTP memory cell cy. In an embodiment, the magnitude of the select voltage Vdd is in the range between 0.75V and 3.6V, and the first program voltage Vp1 is in the range between 4V and 11V. When the select transistor Tsx is turned on in response to the select voltage Vdd provided to the word line WLx and the ground voltage (0V) provided to the bit line BL, a bias voltage Vp1 is applied to the gate oxide layer of the antifuse transistor Tax. Since the first program voltage Vp1 is beyond the withstanding voltage range of the gate oxide layer, the gate oxide layer of the antifuse transistor Tax is ruptured. The ruptured gate oxide layer may be considered as a resistor with a low resistance value of several tens of ohms. In other words, a low-resistance resistor is connected between the antifuse control line AFx and the two drain/source terminals of the antifuse transistor Tax. Under this circumstance, the OTP memory cell cx is in the first storing state.

Figure 2B:
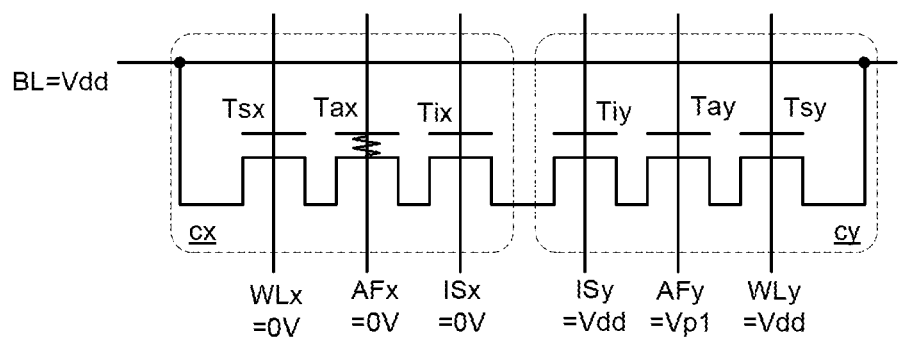

Please refer to FIG. 2B. After the OTP memory cell cx is programmed to the first storing state, the OTP memory cell cy is programmed to a second storing state. As shown in FIG. 2B, a select voltage (Vdd) is provided to the bit line BL, a select voltage Vdd is provided to the word line WLy, a first program voltage Vp1 is provided to the antifuse control line AFy, and the select voltage Vdd is provided to the isolation control line ISy. In addition, the ground voltage (0V) is provided to the word line WLx, the antifuse control line AFx and the isolation control line ISx of the OTP memory cell cx. In an embodiment, the magnitude of the select voltage Vdd is in the range between 0.75V and 3.6V. When the select transistor Tsy is turned off in response to the select voltage Vdd provided to the bit line BL and the word line WLy, a bias voltage Vp1 is applied to the gate oxide layer of the antifuse transistor Tay and the gate oxide layer of the antifuse transistor Tay is not ruptured. The gate oxide layer that is not ruptured may be considered as a resistor with a high resistance value of several mega ohms. In other words, a high-resistance resistor is connected between the antifuse control line AFy and the two drain/source terminals of the antifuse transistor Tay. Under this circumstance, the OTP memory cell cy is in the second storing state.

Please refer to FIGS. 2A and 2B again. During the process of programming the OTP memory cell cx or the OTP memory cell cy, the two antifuse control lines AFx and AFy between the two adjacent OTP memory cells receive different bias voltages. It is noted that numerous modifications and alterations may be made while retaining the teachings of the invention. For example, in another embodiment, the same bias voltage (e.g., the ground voltage) is provided to the two antifuse control lines AFx and AFy. In this embodiment, the select voltage Vdd is provided to the word line WLx (or WLy) and the isolation control line ISx (or ISy) while the OTP memory cell cx is programmed to the first storing state or the OTP memory cell cy is programmed to the second storing state. In another embodiment, the select voltage Vdd is provided to the word line WLx (or WLy) and a control voltage is provided to the isolation control line ISx (or ISy) while the OTP memory cell cx is programmed to the first storing state or the OTP memory cell cy is programmed to the second storing state. The magnitude of the control voltage is lower than or equal to the magnitude of the select voltage Vdd, and the magnitude of the control voltage is higher than or equal to the ground voltage.

Figure 2C:
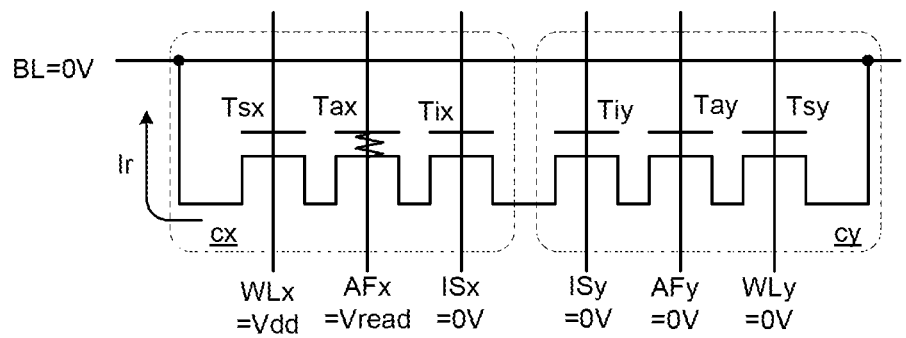

Please refer to FIG. 2C. For reading the OTP memory cell cx, a ground voltage (0V) is provided to the bit line BL, an select voltage Vdd is provided to the word line WLx, a read voltage Vread is provided to the antifuse control line AFx, and the ground voltage (0V) is provided to the isolation control line ISx. In addition, the ground voltage (0V) is provided to the word line WLy, the antifuse control line AFy and the isolation control line ISy of the OTP memory cell cy. In an embodiment, the magnitude of the select voltage Vdd is in the range between 0.75V and 3.6V, and the read voltage Vread is in the range between 0.75V and 3.6V. In this situation, the OTP memory cell cx is in the first storing state. When the select transistor Tsx is turned on in response to the select voltage Vdd, the antifuse transistor Tax generates a read current Ir in response to the read voltage Vread. The read current Ir flows to the bit line BL through the select transistor Tsx. Since a low-resistance resistor is connected between the antifuse control line AFx and the two drain/source terminals of the antifuse transistor Tax, the magnitude of the read current Ir is several microamperes.

Figure 2D:
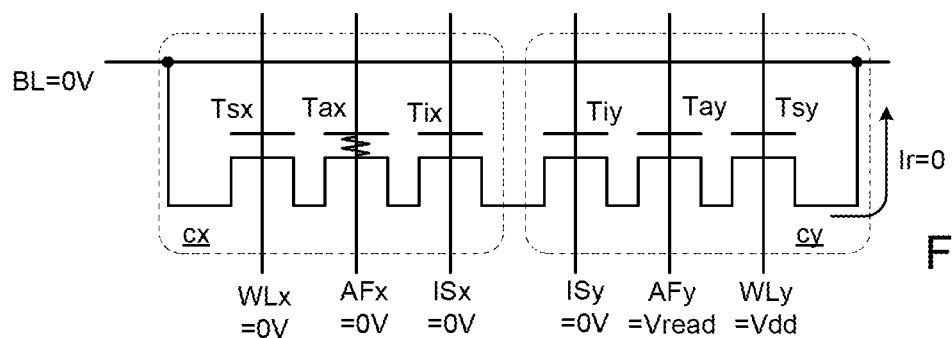

Please refer to FIG. 2D. For reading the OTP memory cell cy, a ground voltage (0V) is provided to the bit line BL, an select voltage Vdd is provided to the word line WLy, a read voltage Vread is provided to the antifuse control line AFy, and the ground voltage (0V) is provided to the isolation control line ISy. In addition, the ground voltage (0V) is provided to the word line WLx, the antifuse control line AFx and the isolation control line ISx of the OTP memory cell cx. In this situation, the OTP memory cell cy is in the second storing state. When the select transistor Tsy is turned on in response to the select voltage Vdd, the antifuse transistor Tay generates a read current Ir in response to the read voltage Vread. The read current Ir flows to the bit line BL through the select transistor Tsy. Since a high-resistance resistor is connected between the antifuse control line AFy and the two drain/source terminals of the antifuse transistor Tay, the magnitude of the read current Ir is very small (much less than 1 microamperes).

In other words, during the read cycle, the OTP memory cell cx and the OTP memory cell cy are respectively judged to have the first storing state and the second storing state according to the magnitude of the read current Ir flowing through the bit line BL. It is noted that numerous modifications and alterations may be made while retaining the teachings of the invention. For example, during the process of manufacturing the OTP memory cells cx and cy, the gate oxide layers of the antifuse transistors Tax and Tay are etched. Consequently, the gate oxide layer of the antifuse transistor Tax is thinner than the gate oxide layers of the select transistor Tsx and the isolation transistor Tix. Also, the gate oxide layer of the antifuse transistor Tay is thinner than the gate oxide layers of the select transistor Tsy and the isolation transistor Tiy. Under this circumstance, the probability of successfully programming the OTP memory cells cx and cy will be further increased. Or, the gate oxide layers of the antifuse transistors Tax and Tay and isolation transistors Tix and Tiy are etched. The gate oxide layers of the antifuse transistor Tax and the isolation transistor Tix are thinner than the gate oxide layer of the select transistor Tsx; and the gate oxide layers of the antifuse transistor Tay and the isolation transistor Tiy are thinner than the gate oxide layer of the select transistor Tsy. Or, the gate oxide layers of the antifuse transistors Tax and Tay and select transistors Tsx and Tsy are etched. The gate oxide layer of the antifuse transistor Tax and the select transistor Tsx are thinner than the gate oxide layer of the isolation transistor Tix; and the gate oxide layer of the antifuse transistor Tay and the select transistor Tsy are thinner than the gate oxide layer of the isolation transistor Tiy.

Figure 3:
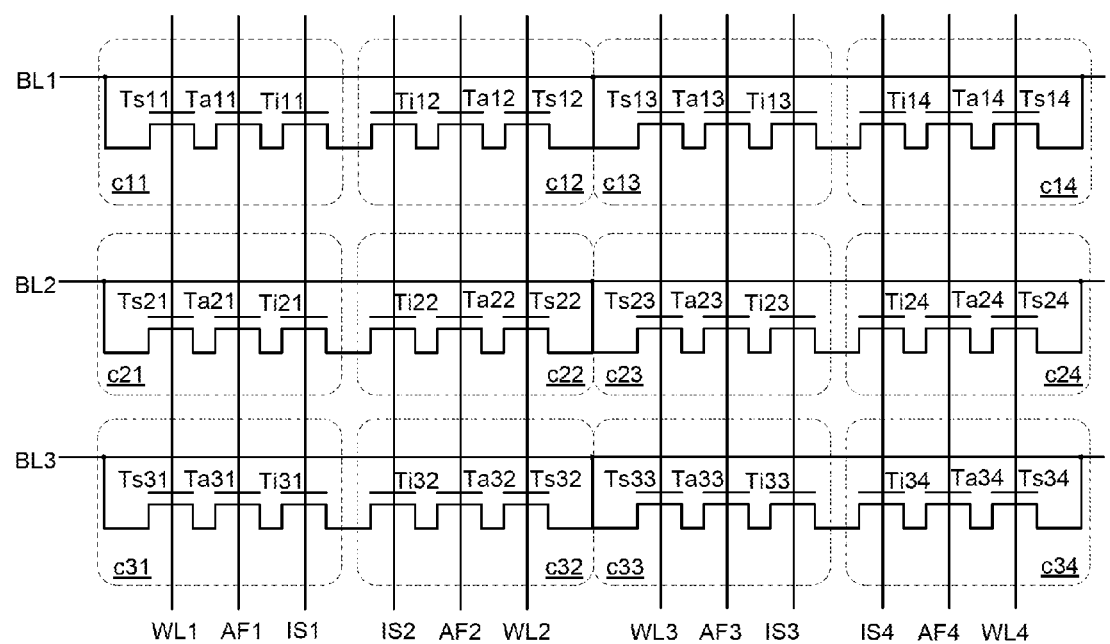
FIG. 3 is a schematic equivalent circuit diagram illustrating an array structure of OTP memory cells according to the first embodiment of the present invention.

FIG. 3 is a schematic equivalent circuit diagram illustrating an array structure of OTP memory cells according to the first embodiment of the present invention. As shown in FIG. 3, the array structure comprises OTP memory cells c11~c34 in a 4×3 array. The OTP memory cells c11, c12, c13 and c14 in the first row are connected with a first bit line BL1, the OTP memory cells c21, c22, c23 and c24 in the second row are connected with a second bit line BL2, and the OTP memory cells c31, c32, c33 and c34 in the third row are connected with a third bit line BL3. Hereinafter, the structures of the OTP memory cells c11~c14 will be illustrated as examples. The structures of the OTP memory cells c21~c24 and c31~c34 are similar to the structures of the OTP memory cells c11~c14, and are not redundantly described herein.

The OTP memory cell c11 comprises a select transistor Ts11, an antifuse transistor Ta11 and an isolation transistor Ti11. A first drain/source terminal of the select transistor Ts11 is connected with a first bit line BL1. A gate terminal of the select transistor Ts11 is connected with a first word line WL1. A first drain/source terminal of the antifuse transistor Ta11 is connected with a second drain/source terminal of the select transistor Ts11. A gate terminal of the antifuse transistor Ta11 is connected with a first antifuse control line AF1. A first drain/source terminal of the isolation transistor Ti11 is connected with a second drain/source terminal of the antifuse transistor Ta11. A gate terminal of the isolation transistor Ti11 is connected with a first isolation control line IS1.

The OTP memory cell c12 comprises a select transistor Ts12, an antifuse transistor Ta12 and an isolation transistor Ti12. A first drain/source terminal of the select transistor Ts12 is connected with the first bit line BL1. A gate terminal of the select transistor Ts12 is connected with a second word line WL2. A first drain/source terminal of the antifuse transistor Ta12 is connected with a second drain/source terminal of the select transistor Ts12. A gate terminal of the antifuse transistor Ta12 is connected with a second antifuse control line AF2. A first drain/source terminal of the isolation transistor Ti12 is connected with a second drain/source terminal of the antifuse transistor Ta12. A gate terminal of the isolation transistor Ti12 is connected with a second isolation control line IS2. Moreover, a second drain/source terminal of the isolation transistor Ti11 of the OTP memory cell dl is connected with a second drain/source terminal of the isolation transistor Ti12 of the OTP memory cell c12.

The OTP memory cell c13 comprises a select transistor Ts13, an antifuse transistor Ta13 and an isolation transistor Ti13. A first drain/source terminal of the select transistor Ts13 is connected with the first bit line BL1. A gate terminal of the select transistor Ts13 is connected with a third word line WL3. A first drain/source terminal of the antifuse transistor Ta13 is connected with a second drain/source terminal of the select transistor Ts13. A gate terminal of the antifuse transistor Ta13 is connected with a third antifuse control line AF3. A first drain/source terminal of the isolation transistor Ti13 is connected with a second drain/source terminal of the antifuse transistor Ta13. A gate terminal of the isolation transistor Ti13 is connected with a third isolation control line IS3.

The OTP memory cell c14 comprises a select transistor Ts14, an antifuse transistor Ta14 and an isolation transistor Ti14. A first drain/source terminal of the select transistor Ts14 is connected with the first bit line BL1. A gate terminal of the select transistor Ts14 is connected with a fourth word line WL4. A first drain/source terminal of the antifuse transistor Ta14 is connected with a second drain/source terminal of the select transistor Ts14. A gate terminal of the antifuse transistor Ta14 is connected with a fourth antifuse control line AF4. A first drain/source terminal of the isolation transistor Ti14 is connected with a second drain/source terminal of the antifuse transistor Ta14. A gate terminal of the isolation transistor Ti14 is connected with a fourth isolation control line IS4. Moreover, a second drain/source terminal of the isolation transistor Ti13 of the OTP memory cell c13 is connected with a second drain/source terminal of the isolation transistor Ti14 of the OTP memory cell c14.

Figure 4A:
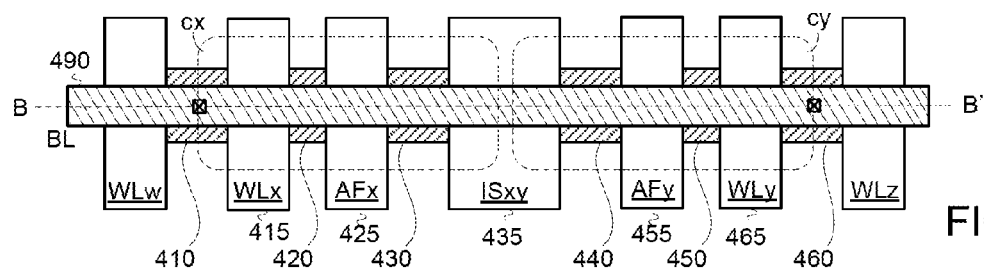
FIG. 4A is a schematic top view of an antifuse-type one time programming memory cell according to a second embodiment of the present invention.
Figure 4B:
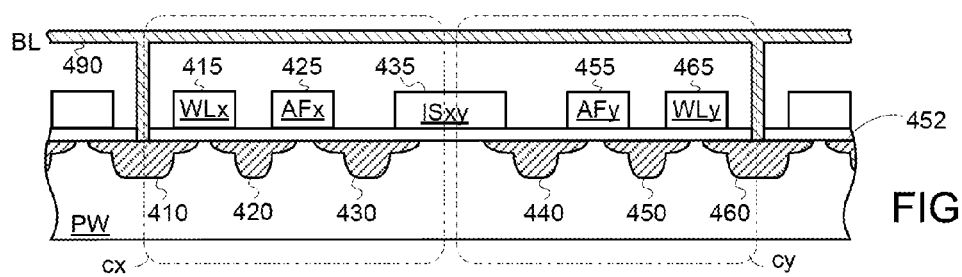
FIG. 4B is a schematic cross-sectional view of the antifuse-type one time programming memory cell of FIG. 4A and taken along a line BB'.
Figure 4C:
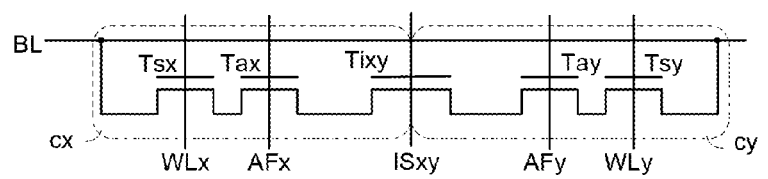
FIG. 4C is a schematic equivalent circuit diagram of the antifuse-type one time programming memory cell according to the second embodiment of the present invention.

FIG. 4A is a schematic top view of an antifuse-type one time programming memory cell according to a second embodiment of the present invention. FIG. 4B is a schematic cross-sectional view of the antifuse-type one time programming memory cell of FIG. 4A and taken along a line BB'. FIG. 4C is a schematic equivalent circuit diagram of the antifuse-type one time programming memory cell according to the second embodiment of the present invention. For brevity, the antifuse-type one time programming memory cell is also referred as an OTP memory cell. In comparison with the first embodiment, a single isolation transistor Tixy is serially connected between the two antifuse transistors Tax and Tay.

As shown in FIGS. 4A and 4B, two OTP memory cells cx and cy are constructed in a P-well region PW. A first doped region 410, a second doped region 420, a third doped region 430, a fourth doped region 440, a fifth doped region 450 and a sixth doped region 460 are formed under a top surface of the P-well region PW. Moreover, a gate oxide layer 452 covers the top surface of the P-well region PW. In this embodiment, the six doped regions 410, 420, 430, 440, 450 and 460 are N-type doped regions.

The structure of the OTP memory cell cx will be described as follows. A first gate 415 is formed on the gate oxide layer 452 and spanned over the first doped region 410 and the second doped region 420. Moreover, the first gate 415 is connected with a word line WLx. A second gate 425 is formed on the gate oxide layer 452 and spanned over the second doped region 420 and the third doped region 430. The second gate 425 is connected with an antifuse control line AFx. A third gate 435 is formed on the gate oxide layer 452 and spanned over the third doped region 430 and the fourth doped region 440. The third gate 435 is connected with an isolation control line ISxy.

The structure of the OTP memory cell cy will be described as follows. A fourth gate 465 is formed on the gate oxide layer 452 and spanned over the sixth doped region 460 and the fifth doped region 450. Moreover, the fourth gate 465 is connected with a word line WLy. A fifth gate 455 is formed on the gate oxide layer 452 and spanned over the fifth doped region 450 and the fourth doped region 440. The fifth gate 455 is connected with an antifuse control line AFy.

In this embodiment, the third gate 435, the third doped region 430 and the fourth doped region 440 are collaboratively formed as an isolation transistor Tixy. Moreover, the isolation transistor Tixy is shared by the OTP memory cells cx and cy.

A first metal layer 490 is disposed over the six gates 415, 425, 435, 455 and 465. Moreover, the first metal layer 490 is connected with the first doped region 410 and the sixth doped region 460 through two vias. The first metal layer 490 is used as a bit line BL of the OTP memory cells cx and Cy.

Please refer to FIG. 4C. The first doped region 410, the second doped region 420 and the first gate 415 are collaboratively formed as a select transistor Tsx. The second doped region 420, the third doped region 430 and the second gate 425 are collaboratively formed as an antifuse transistor. The third doped region 430, the fourth doped region 440 and the third gate 435 are collaboratively formed as an isolation transistor Tixy. The sixth doped region 460, the fifth doped region 450 and the fourth gate 465 are collaboratively formed as a select transistor Tsy. The fifth doped region 450, the fourth doped region 440 and the fifth gate 455 are collaboratively formed as an antifuse transistor Tay.

A first drain/source terminal of the select transistor Tsx is connected with the bit line BL. A gate terminal of the select transistor Tsx is connected with the word line WLx. A first drain/source terminal of the antifuse transistor Tax is connected with a second drain/source terminal of the select transistor Tsx. A gate terminal of the antifuse transistor Tax is connected with the antifuse control line AFx. A first drain/source terminal of the select transistor Tsy is connected with the bit line BL. A gate terminal of the select transistor Tsy is connected with the word line WLy. A first drain/source terminal of the antifuse transistor Tay is connected with a second drain/source terminal of the select transistor Tsy. A gate terminal of the antifuse transistor Tay is connected with the antifuse control line AFy. A first drain/source terminal of the isolation transistor Tixy is connected with a second drain/source terminal of the antifuse transistor Tax. A gate terminal of the isolation transistor Tixy is connected with the isolation control line ISxy. A second drain/source terminal of the isolation transistor Tixy is connected with a second drain/source terminal of the antifuse transistor Tay.

In this embodiment, one isolation transistor Tixy is serially connected between the second drain/source terminal of the antifuse transistor Tax of the OTP memory cell cx and the second drain/source terminal of the antifuse transistor Tay of the OTP memory cell cy. Since the OTP memory cell cx and the OTP memory cell cy are isolated by the isolation transistor Tixy, it is not necessary to form a shallow trench isolation structure in the P-well region.

FIGS. 5A~5D schematically illustrate associated voltage signals for programming and reading the OTP memory cell according to the second embodiment of the present invention.

Figure 5A:
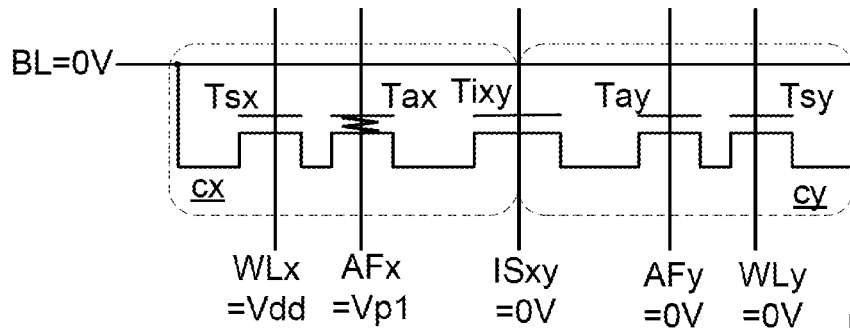
FIGS. 5A~5D schematically illustrate associated voltage signals for programming and reading the OTP memory cell according to the second embodiment of the present invention.

Please refer to FIG. 5A. For programming the OTP memory cell cx to a first storing state, a ground voltage (0V) is provided to the bit line BL, an select voltage Vdd is provided to the word line WLx, a first program voltage Vp1 is provided to the antifuse control line AFx, and the ground voltage (0V) is provided to the isolation control line ISxy. In addition, the ground voltage (0V) is provided to the word line WLy and the antifuse control line AFy of the OTP memory cell cy. In an embodiment, the magnitude of the select voltage Vdd is in the range between 0.75V and 3.6V, and the first program voltage Vp1 is in the range between 4V and 11V. When the select transistor Tsx is turned on in response to the select voltage Vdd provided to the world line WLx and the ground voltage (0V) provided to the bit line BL, a bias voltage Vp1 is applied to the gate oxide layer of the antifuse transistor Tax. Since the first program voltage Vp1 is beyond the withstanding voltage range of the gate oxide layer, the gate oxide layer of the antifuse transistor Tax is ruptured. The ruptured gate oxide layer may be considered as a resistor with a low resistance value of several tens of ohms. In other words, a low-resistance resistor is connected between the antifuse control line AFx and the two drain/source terminals of the antifuse transistor Tax. Under this circumstance, the OTP memory cell cx is in the first storing state.

Figure 5B:
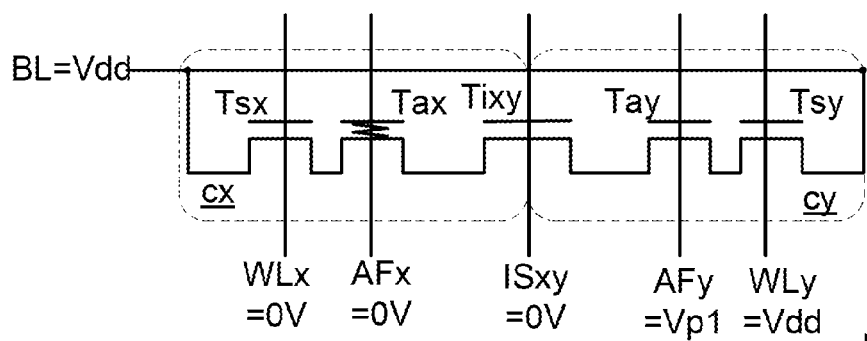

Please refer to FIG. 5B. After the OTP memory cell cx is programmed to the first storing state, the OTP memory cell cy is programmed to a second storing state. As shown in FIG. 4B, a select voltage (Vdd) is provided to the bit line BL, the select voltage Vdd is provided to the word line WLy, a first program voltage Vp1 is provided to the antifuse control line AFy, and the ground voltage (0V) is provided to the isolation control line ISxy. In addition, the ground voltage (0V) is provided to the word line WLx and the antifuse control line AFx of the OTP memory cell cx. In an embodiment, the magnitude of the select voltage Vdd is in the range between 0.75V and 3.6V. When the select transistor Tsy is turned off in response to the select voltage Vdd provided to the word line Wly and the bit line BL, a bias voltage Vp1 is applied to the gate oxide layer of the antifuse transistor Tay and the gate oxide layer of the antifuse transistor Tay is not ruptured. The gate oxide layer that is not ruptured may be considered as a resistor with a high resistance value of several mega ohms. In other words, a high-resistance resistor is connected between the antifuse control line AFy and the two drain/source terminals of the antifuse transistor Tay. Under this circumstance, the OTP memory cell cy is in the second storing state.

Figure 5C:
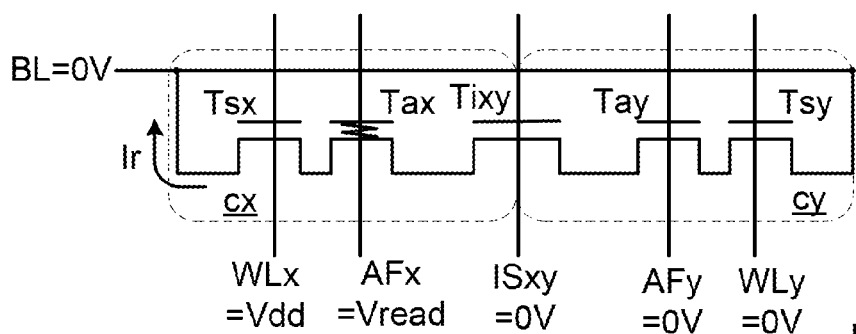

Please refer to FIG. 5C. For reading the OTP memory cell cx, a ground voltage (0V) is provided to the bit line BL, an select voltage Vdd is provided to the word line WLx, a read voltage Vread is provided to the antifuse control line AFx, and the ground voltage (0V) is provided to the isolation control line ISxy. In addition, the ground voltage (0V) is provided to the word line WLy and the antifuse control line AFy of the OTP memory cell cy. In an embodiment, the magnitude of the select voltage Vdd is in the range between 0.75V and 3.6V, and the read voltage Vread is in the range between 0.75V and 3.6V. In this situation, the OTP memory cell cx is in the first storing state. When the select transistor Tsx is turned on in response to the select voltage Vdd, the antifuse transistor Tax generates a read current Ir in response to the read voltage Vread. The read current Ir flows to the bit line BL through the select transistor Tsx. Since a low-resistance resistor is connected between the antifuse control line AFx and the two drain/source terminals of the antifuse transistor Tax, the magnitude of the read current Ir is several microamperes.

Figure 5D:
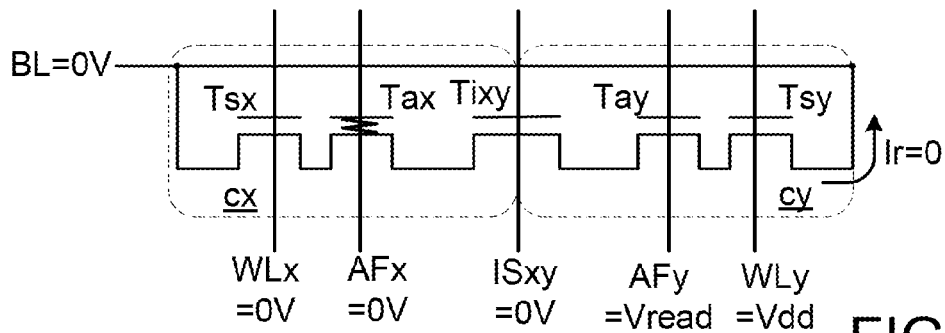

Please refer to FIG. 5D. For reading the OTP memory cell cy, a ground voltage (0V) is provided to the bit line BL, an select voltage Vdd is provided to the word line WLy, a read voltage Vread is provided to the antifuse control line AFy, and the ground voltage (0V) is provided to the isolation control line ISxy. In addition, the ground voltage (0V) is provided to the word line WLx and the antifuse control line AFx of the OTP memory cell cx. In this situation, the OTP memory cell cy is in the second storing state. When the select transistor Tsy is turned on in response to the select voltage Vdd, the antifuse transistor Tay generates a read current Ir in response to the read voltage Vread. The read current Ir flows to the bit line BL through the select transistor Tsy. Since a high-resistance resistor is connected between the antifuse control line AFy and the two drain/source terminals of the antifuse transistor Tay, the magnitude of the read current Ir is very small (much less than 1 microamperes).

In other words, during the read cycle, the OTP memory cell cx and the OTP memory cell cy are respectively judged to have the first storing state and the second storing state according to the magnitude of the read current Ir flowing through the bit line BL. It is noted that numerous modifications and alterations may be made while retaining the teachings of the invention. For example, during the process of manufacturing the OTP memory cells cx and cy, the gate oxide layers of the antifuse transistors Tax and Tay are etched. Consequently, the gate oxide layer of the antifuse transistor Tax is thinner than the gate oxide layers of the select transistor Tsx and the isolation transistor Tixy, and the gate oxide layer of the antifuse transistor Tay is thinner than the gate oxide layers of the select transistor Tsy and the isolation transistor Tixy. Under this circumstance, the probability of successfully programming the OTP memory cells cx and cy will be further increased. Or, the gate oxide layers of the antifuse transistors Tax and Tay and isolation transistors Tixy are etched. The gate oxide layers of the antifuse transistor Tax and the isolation transistor Tixy are thinner than the gate oxide layer of the select transistor Tsx; and the gate oxide layers of the antifuse transistor Tay and the isolation transistor Tixy are thinner than the gate oxide layer of the select transistor Tsy. Or, the gate oxide layers of the antifuse transistors Tax and Tay and select transistors Tsx and Tsy are etched. The gate oxide layer of the antifuse transistor Tax and the select transistor Tsx are thinner than the gate oxide layer of the isolation transistor Tixy; and the gate oxide layer of the antifuse transistor Tay and the select transistor Tsy are thinner than the gate oxide layer of the isolation transistor Tixy.

Figure 6:
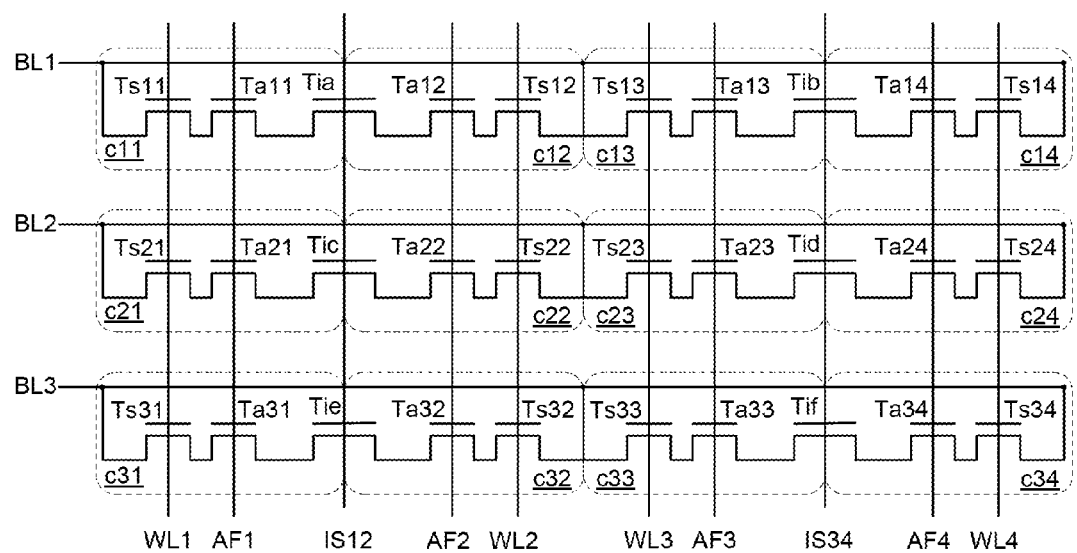
FIG. 6 is a schematic equivalent circuit diagram illustrating an array structure of OTP memory cells according to the second embodiment of the present invention.

FIG. 6 is a schematic equivalent circuit diagram illustrating an array structure of OTP memory cells according to the second embodiment of the present invention. As shown in FIG. 6, the array structure comprises OTP memory cells c11~c34 in a 4×3 array. The OTP memory cells c11, c12, c13 and c14 in the first row are connected with a first bit line BL1, the OTP memory cells c21, c22, c23 and c24 in the second row are connected with a second bit line BL2, and the OTP memory cells c31, c32, c33 and c34 in the third row are connected with a third bit line BL3. Hereinafter, the structures of the OTP memory cells c11~c14 will be illustrated as examples. The structures of the OTP memory cells c21~c24 and c31~c34 are similar to the structures of the OTP memory cells c11~c14, and are not redundantly described herein.

The combination of the OTP memory cell c11 and the OTP memory cell c12 comprises a select transistor Ts11, an antifuse transistor Ta11, an isolation transistor Tia, a select transistor Ts12 and an antifuse transistor Ta12.

A first drain/source terminal of the select transistor Ts11 is connected with a first bit line BL1. A gate terminal of the select transistor Ts11 is connected with a first word line WL1. A first drain/source terminal of the antifuse transistor Ta11 is connected with a second drain/source terminal of the select transistor Ts11. A gate terminal of the antifuse transistor Ta11 is connected with a first antifuse control line AF1. A first drain/source terminal of the select transistor Ts12 is connected with the first bit line BL1. A gate terminal of the select transistor Ts12 is connected with a second word line WL2. A first drain/source terminal of the antifuse transistor Ta12 is connected with a second drain/source terminal of the select transistor Ts12. A gate terminal of the antifuse transistor Ta12 is connected with a second antifuse control line AF2. A first drain/source terminal of the isolation transistor Tia is connected with a second drain/source terminal of the antifuse transistor Ta11. A gate terminal of the isolation transistor Tia is connected with a first isolation control line IS12. A second drain/source terminal of the isolation transistor Tia is connected with a second drain/source terminal of the antifuse transistor Ta12.

The combination of the OTP memory cell c13 and the OTP memory cell c14 comprises a select transistor Ts13, an antifuse transistor Ta13, an isolation transistor Tib, a select transistor Ts14 and an antifuse transistor Ta14.

A first drain/source terminal of the select transistor Ts13 is connected with a first bit line BL1. A gate terminal of the select transistor Ts13 is connected with a third word line WL3. A first drain/source terminal of the antifuse transistor Ta13 is connected with a second drain/source terminal of the select transistor Ts13. A gate terminal of the antifuse transistor Ta13 is connected with a third antifuse control line AF3. A first drain/source terminal of the select transistor Ts14 is connected with the first bit line BL1. A gate terminal of the select transistor Ts14 is connected with a fourth word line WL4. A first drain/source terminal of the antifuse transistor Ta14 is connected with a second drain/source terminal of the select transistor Ts14. A gate terminal of the antifuse transistor Ta14 is connected with a fourth antifuse control line AF4. A first drain/source terminal of the isolation transistor Tib is connected with a second drain/source terminal of the antifuse transistor Ta13. A gate terminal of the isolation transistor Tib is connected with a second isolation control line IS34. A second drain/source terminal of the isolation transistor Tib is connected with a second drain/source terminal of the antifuse transistor Ta14.

Figure 7A:
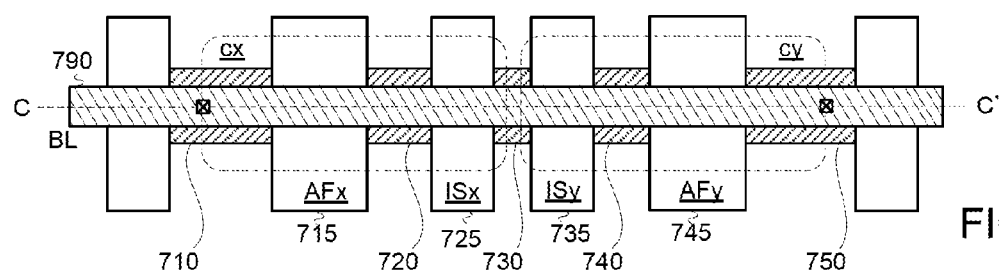
FIG. 7A is a schematic top view of an antifuse-type one time programming memory cell according to a third embodiment of the present invention.
Figure 7B:
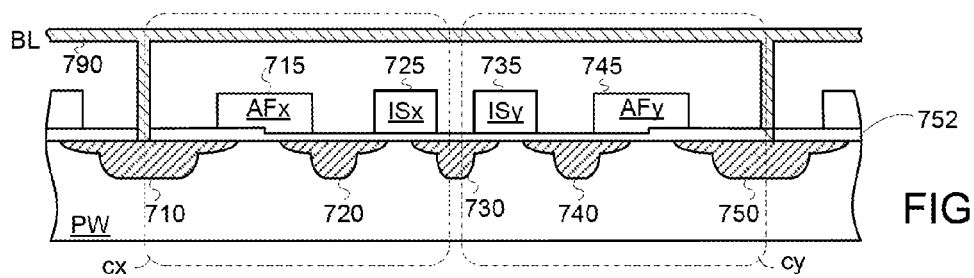
FIG. 7B is a schematic cross-sectional view of the antifuse-type one time programming memory cell of FIG. 7A and taken along a line CC'.
Figure 7C:
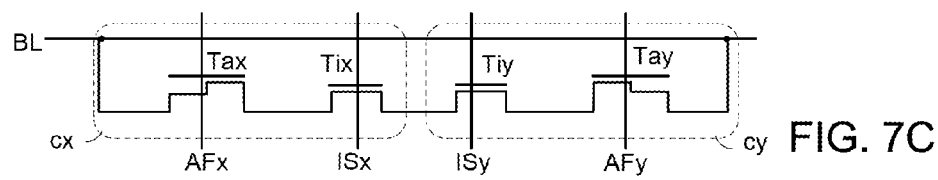
FIG. 7C is a schematic equivalent circuit diagram of the antifuse-type one time programming memory cell according to the third embodiment of the present invention.

FIG. 7A is a schematic top view of an antifuse-type one time programming memory cell according to a third embodiment of the present invention. FIG. 7B is a schematic cross-sectional view of the antifuse-type one time programming memory cell of FIG. 7A and taken along a line CC'. FIG. 7C is a schematic equivalent circuit diagram of the antifuse-type one time programming memory cell according to the third embodiment of the present invention. For brevity, the antifuse-type one time programming memory cell is also referred as an OTP memory cell.

As shown in FIGS. 7A and 7B, two OTP memory cells cx and cy are constructed in a P-well region PW. A first doped region 710, a second doped region 720, a third doped region 730, a fourth doped region 740 and a fifth doped region 750 are formed under a top surface of the P-well region PW. Moreover, a gate oxide layer 752 covers the top surface of the P-well region PW. In this embodiment, the portion of the gate oxide layer 752 between the first doped region 710 and the fifth doped region 750 is etched. Consequently, the gate oxide layer 752 closer to the second doped region 720 is thinner than the gate oxide layer 752 closer to the first doped region 710. Similarly, the gate oxide layer 752 closer to the fourth doped region 740 is thinner than the gate oxide layer 752 closer to the fifth doped region 750. Also, the gate oxide layer 752 under the second gate 725 and the fourth gate 735 is thinner.

The structure of the OTP memory cell cx will be described as follows. A first gate 715 is formed on the gate oxide layer 752 and spanned over the first doped region 710 and the second doped region 720. Moreover, the first gate 715 is connected with an antifuse control line AFx. A second gate 725 is formed on the gate oxide layer 752 and spanned over the second doped region 720 and the third doped region 730. The second gate 725 is connected with an isolation control line ISx. Moreover, the gate oxide layer 752 under the first gate 715 is divided into a first part and a second part. The first part is closer to the first doped region 710. The second part is closer to the second doped region 720. The first part is thicker than the second part.

The structure of the OTP memory cell cy will be described as follows. A third gate 745 is formed on the gate oxide layer 752 and spanned over the fifth doped region 750 and the fourth doped region 740. Moreover, the third gate 745 is connected with an antifuse control line AFy. A fourth gate 735 is formed on the gate oxide layer 752 and spanned over the fourth doped region 740 and the third doped region 730. The fourth gate 735 is connected with an isolation control line ISy. Moreover, the gate oxide layer 752 under the third gate 745 is divided into a third part and a fourth part. The third part is closer to the fifth doped region 750. The fourth part is closer to the fourth doped region 740. The third part is thicker than the fourth part.

A first metal layer 790 is disposed over the four gates 715, 725, 735 and 745. Moreover, the first metal layer 790 is connected with the first doped region 710 and the fifth doped region 750 through two vias. The first metal layer 790 is used as a bit line BL of the OTP memory cells cx and cy.

Please refer to FIG. 7B and FIG. 7C. The first doped region 710, the second doped region 720 and the first gate 715 are collaboratively formed as an antifuse transistor Tax of the OTP memory cell cx. The second doped region 720, the third doped region 730 and the second gate 725 are collaboratively formed as an isolation transistor Tix of the OTP memory cell cx. A first drain/source terminal of the antifuse transistor Tax is connected with the bit line BL. A gate terminal of the antifuse transistor Tax is connected with the antifuse control line AFx. A first drain/source terminal of the isolation transistor Tix is connected with a second drain/source terminal of the antifuse transistor Tax. A gate terminal of the isolation transistor Tix is connected with the isolation control line ISx.

The fifth doped region 750, the fourth doped region 740 and the third gate 745 are collaboratively formed as an antifuse transistor Tay of the OTP memory cell cy. The fourth doped region 740, the third doped region 730 and the fourth gate 735 are collaboratively formed as an isolation transistor Tiy of the OTP memory cell cy. A first drain/source terminal of the antifuse transistor Tay is connected with the bit line BL. A gate terminal of the antifuse transistor Tay is connected with the antifuse control line AFy. A first drain/source terminal of the isolation transistor Tiy is connected with a second drain/source terminal of the antifuse transistor Tay. A gate terminal of the isolation transistor Tiy is connected with the isolation control line ISy.

In this embodiment, a second drain/source terminal of the isolation transistor Tix of the OTP memory cell cx is connected with a second drain/source terminal of the isolation transistor Tiy of the OTP memory cell cy. In other words, two isolation transistors Tix and Tiy are serially connected between the second drain/source terminal of the antifuse transistor Tax of the OTP memory cell cx and the second drain/source terminal of the antifuse transistor Tay of the OTP memory cell cy. Under this circumstance, it is not necessary to form a shallow trench isolation structure in the P-well region to isolate the OTP memory cell cx from the OTP memory cell cy.

FIGS. 8A~8D schematically illustrate associated voltage signals for programming and reading the OTP memory cell according to the third embodiment of the present invention.

Figure 8A:
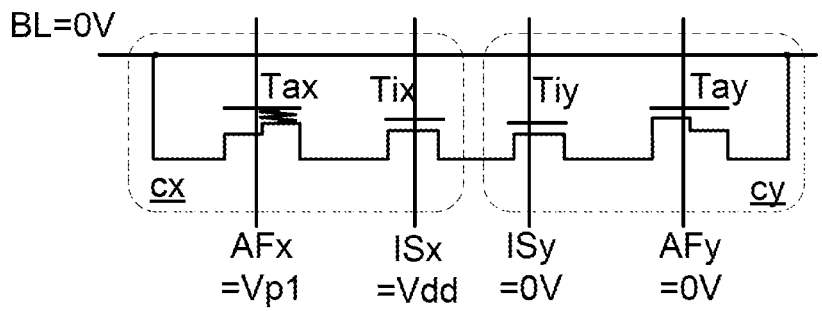
FIGS. 8A~8D schematically illustrate associated voltage signals for programming and reading the OTP memory cell according to the third embodiment of the present invention.

Please refer to FIG. 8A. For programming the OTP memory cell cx to a first storing state, a ground voltage (0V) is provided to the bit line BL, a first program voltage Vp1 is provided to the antifuse control line AFx, and an select voltage Vdd is provided to the isolation control line ISx. In addition, the ground voltage (0V) is provided to the antifuse control line AFy and the isolation control line ISy of the OTP memory cell cy. In an embodiment, the magnitude of the select voltage Vdd is in the range between 0.75V and 3.6V, and the first program voltage Vp1 is in the range between 4V and 11V. In this situation, the ground voltage (0V) is provided to the bit line BL and the bias voltage Vp1 is applied to the gate oxide layer of the antifuse transistor Tax. Since the first program voltage Vp1 is beyond the withstanding voltage range of the gate oxide layer, the second part of the gate oxide layer (i.e., the thinner part) of the antifuse transistor Tax is ruptured. The ruptured gate oxide layer may be considered as a resistor with a low resistance value of several tens of ohms. In other words, a low-resistance resistor is connected between the antifuse control line AFx and the two drain/source terminals of the antifuse transistor Tax. Under this circumstance, the OTP memory cell cx is in the first storing state.

Figure 8B:
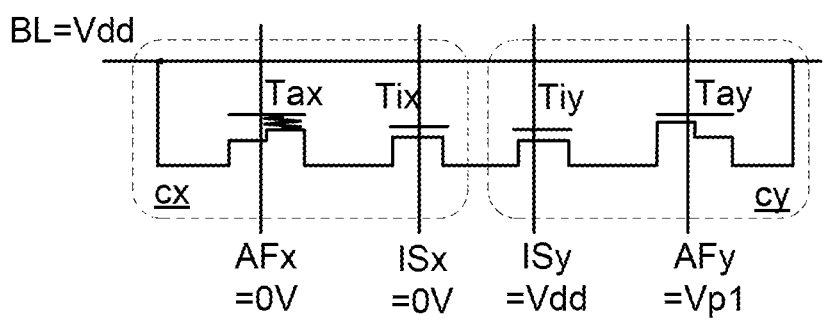

Please refer to FIG. 8B. After the OTP memory cell cx is programmed to the first storing state, the OTP memory cell cy is programmed to a second storing state. As shown in FIG. 8B, a select voltage (Vdd) is provided to the bit line BL, a first program voltage Vp1 is provided to the antifuse control line AFy, and the select voltage Vdd is provided to the isolation control line ISy. In addition, the ground voltage (0V) is provided to the antifuse control line AFx and the isolation control line ISx of the OTP memory cell cx. In an embodiment, the magnitude of the select voltage Vdd is in the range between 0.75V and 3.6V. In this situation, the select voltage is provided to the bit line BL and the bias voltage Vp1 is applied to the gate oxide layer of the antifuse transistor Tay. The gate oxide layer of the antifuse transistor Tay is not ruptured. The gate oxide layer that is not ruptured may be considered as a resistor with a high resistance value of several mega ohms. In other words, a high-resistance resistor is connected between the antifuse control line AFy and the two drain/source terminals of the antifuse transistor Tay. Under this circumstance, the OTP memory cell cy is in the second storing state.

Please refer to FIGS. 8A and 8B again. During the process of programming the OTP memory cell cx or the OTP memory cell cy, the two antifuse control lines AFx and AFy between the two adjacent OTP memory cells receive different bias voltages. It is noted that numerous modifications and alterations may be made while retaining the teachings of the invention. For example, in another embodiment, the same bias voltage (e.g., the ground voltage) is provided to the two antifuse control lines AFx and AFy.

Figure 8C:
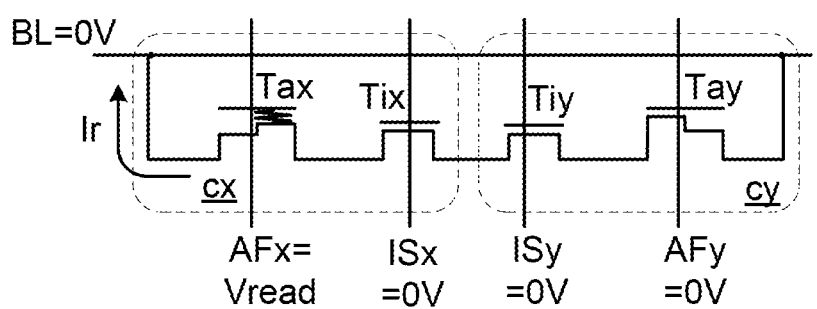

Please refer to FIG. 8C. For reading the OTP memory cell cx, a ground voltage (0V) is provided to the bit line BL, a read voltage Vread is provided to the antifuse control line AFx, and the ground voltage (0V) is provided to the isolation control line ISx. In addition, the ground voltage (0V) is provided to the antifuse control line AFy and the isolation control line ISy of the OTP memory cell cy. In an embodiment, the magnitude of the select voltage Vdd is in the range between 0.75V and 3.6V, and the read voltage Vread is in the range between 0.75V and 3.6V. In this situation, the OTP memory cell cx is in the first storing state. The antifuse transistor Tax generates a read current Ir in response to the read voltage Vread. The read current Ir flows to the bit line BL through the select transistor Tsx. Since a low-resistance resistor is connected between the antifuse control line AFx and the two drain/source terminals of the antifuse transistor Tax, the magnitude of the read current Ir is several microamperes.

Figure 8D:
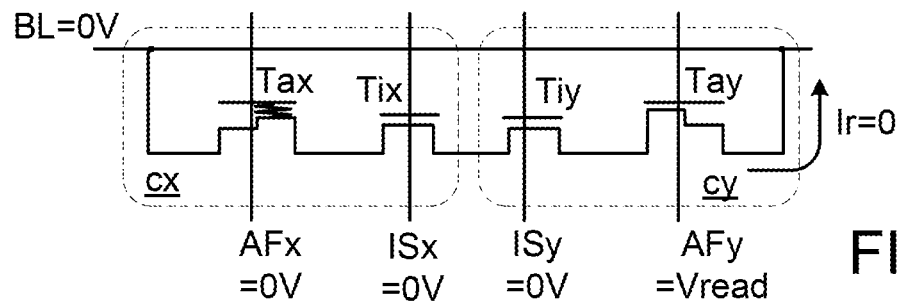

Please refer to FIG. 8D. For reading the OTP memory cell cy, a ground voltage (0V) is provided to the bit line BL, a read voltage Vread is provided to the antifuse control line AFy, and the ground voltage (0V) is provided to the isolation control line ISy. In addition, the ground voltage (0V) is provided to the antifuse control line AFx and the isolation control line ISx of the OTP memory cell cx. In this situation, the OTP memory cell cy is in the second storing state. The antifuse transistor Tay generates a read current Ir in response to the read voltage Vread. The read current Ir flows to the bit line BL through the select transistor Tsy. Since a high-resistance resistor is connected between the antifuse control line AFy and the two drain/source terminals of the antifuse transistor Tay, the magnitude of the read current Ir is very small (much less than 1 microamperes).

In other words, during the read cycle, the OTP memory cell cx and the OTP memory cell cy are respectively judged to have the first storing state and the second storing state according to the magnitude of the read current Ir flowing through the bit line BL.

In the third embodiment of the present invention, the two OTP memory cells cx and cy are isolated from each other through two isolation transistors Tix and Tiy. It is noted that numerous modifications and alterations may be made while retaining the teachings of the second embodiment and the third embodiment. For example, in a variant example, a single isolation transistor is arranged between the antifuse transistors Tax and Tay in order for achieving the isolating efficacy. Or, during the etching process of manufacturing the OTP memory cells cx, only the gate oxide layer 752 between the first doped region 710 and the second doped region 720 are etched. Consequently, the first part of the gate oxide layer of the antifuse transistor Tax has thickness thinner than the gate oxide layer of the isolation transistor Tix.

Figure 9:
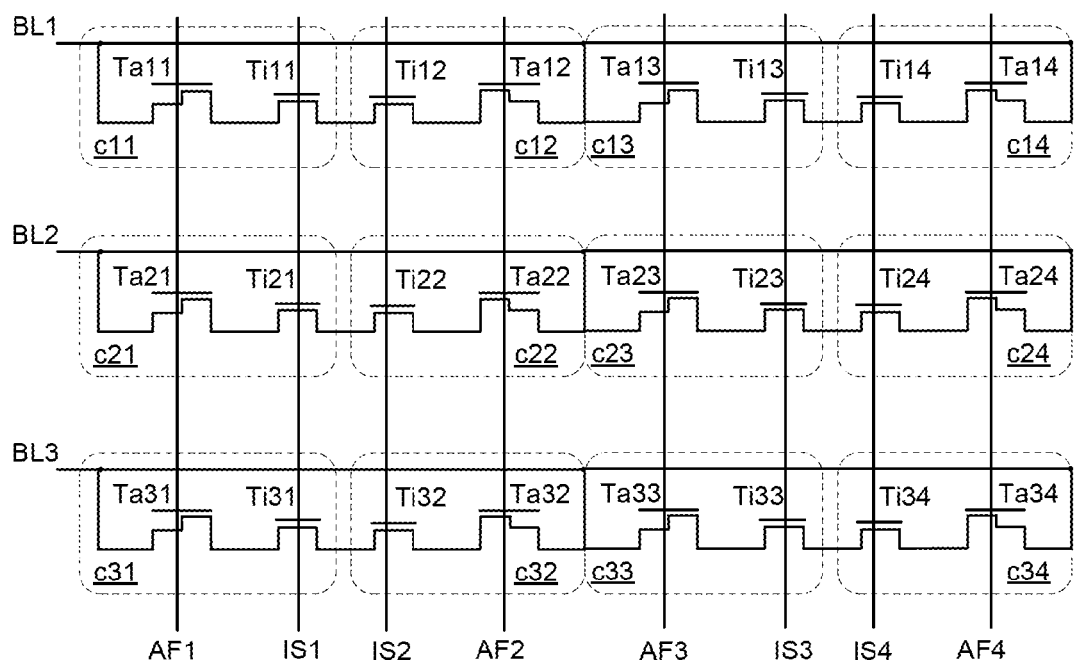
FIG. 9 is a schematic equivalent circuit diagram illustrating an array structure of OTP memory cells according to the third embodiment of the present invention.

FIG. 9 is a schematic equivalent circuit diagram illustrating an array structure of OTP memory cells according to the third embodiment of the present invention. As shown in FIG. 3, the array structure comprises OTP memory cells c11~c34 in a 4×3 array. The OTP memory cells c11, c12, c13 and c14 in the first row are connected with a first bit line BL1, the OTP memory cells c21, c22, c23 and c24 in the second row are connected with a second bit line BL2, and the OTP memory cells c31, c32, c33 and c34 in the third row are connected with a third bit line BL3. Hereinafter, the structures of the OTP memory cells c11~c14 will be illustrated as examples. The structures of the OTP memory cells c21~c24 and c31~c34 are similar to the structures of the OTP memory cells c11~c14, and are not redundantly described herein.

The OTP memory cell c11 comprises an antifuse transistor Ta11 and an isolation transistor Ti11. A first drain/source terminal of the antifuse transistor Ta11 is connected with a first bit line BL1. A gate terminal of the antifuse transistor Ta11 is connected with a first antifuse control line AF1. A first drain/source terminal of the isolation transistor Ti11 is connected with a second drain/source terminal of the antifuse transistor Ta11. A gate terminal of the isolation transistor Ti11 is connected with a first isolation control line IS1.

The OTP memory cell c12 comprises an antifuse transistor Ta12 and an isolation transistor Ti12. A first drain/source terminal of the antifuse transistor Ta12 is connected with the first bit line BL1. A gate terminal of the antifuse transistor Ta12 is connected with a second antifuse control line AF2. A first drain/source terminal of the isolation transistor Ti12 is connected with a second drain/source terminal of the antifuse transistor Ta12. A gate terminal of the isolation transistor Ti12 is connected with a second isolation control line IS2. Moreover, a second drain/source terminal of the isolation transistor Ti11 of the OTP memory cell c11 is connected with a second drain/source terminal of the isolation transistor Ti12 of the OTP memory cell c12.

The OTP memory cell c13 comprises an antifuse transistor Ta13 and an isolation transistor Ti13. A first drain/source terminal of the antifuse transistor Ta13 is connected with the first bit line BL1. A gate terminal of the antifuse transistor Ta13 is connected with a third antifuse control line AF3. A first drain/source terminal of the isolation transistor Ti13 is connected with a second drain/source terminal of the antifuse transistor Ta13. A gate terminal of the isolation transistor Ti13 is connected with a third isolation control line IS3.

The OTP memory cell c14 comprises an antifuse transistor Ta14 and an isolation transistor Ti14. A first drain/source terminal of the antifuse transistor Ta14 is connected with the first bit line BL1. A gate terminal of the antifuse transistor Ta14 is connected with a fourth antifuse control line AF4. A first drain/source terminal of the isolation transistor Ti14 is connected with a second drain/source terminal of the antifuse transistor Ta14. A gate terminal of the isolation transistor Ti14 is connected with a fourth isolation control line IS4. Moreover, a second drain/source terminal of the isolation transistor Ti13 of the OTP memory cell c13 is connected with a second drain/source terminal of the isolation transistor Ti14 of the OTP memory cell c14.

From the above descriptions, the present invention provides an antifuse-type one time programming memory cell and an array structure with this memory cell. At least one isolation transistor is arranged between two adjacent OTP memory cells to isolate the OTP memory cells. Under this circumstance, it is not necessary to form a shallow trench isolation structure in the P-well region to isolate the OTP memory cells. Consequently, the complexity of the fabricating process is largely reduced, and the layout area of the array structure is effectively reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An array structure connected with a first bit line, a first word line, a second word line, a first antifuse control line, a second antifuse control line, a first isolation control line and a second isolation control line, the array structure comprising:
- a well region;
- a first doped region, a second doped region, a third doped region, a fourth doped region, a fifth doped region, a sixth doped region and a seventh doped region formed in a surface of the well region;
- a gate oxide layer covering the surface of the well region;
- a first gate formed on the gate oxide layer and spanned over the first doped region and the second doped region, wherein the first gate is connected with the first word line;
- a second gate formed on the gate oxide layer and spanned over the second doped region and the third doped region, wherein the second gate is connected with the first antifuse control line;
- a third gate formed on the gate oxide layer and spanned over the third doped region and the fourth doped region, wherein the third gate is connected with the first isolation control line;
- a fourth gate formed on the gate oxide layer and spanned over the seventh doped region and the sixth doped region, wherein the fourth gate is connected with the second word line;
- a fifth gate formed on the gate oxide layer and spanned over the sixth doped region and the fifth doped region, wherein the fifth gate is connected with the second antifuse control line;
- a sixth gate formed on the gate oxide layer and spanned over the fifth doped region and the fourth doped region, wherein the sixth gate is connected with the second isolation control line; and
- a first metal layer connected with the first doped region through a first via and connected with the seventh doped region through a second via, wherein the first metal layer is the first bit line.

2. The array structure as claimed in claim 1, wherein the gate oxide layer under the second gate is thinner than the gate oxide layer under the first gate, and the gate oxide layer under the fifth gate is thinner than the gate oxide layer under the fourth gate.

3. The array structure as claimed in claim 1, further comprising:
- an eighth doped region, a ninth doped region, a tenth doped region, an eleventh doped region, a twelfth doped region, a thirteenth doped region and a fourteenth doped region formed in the surface of the well region;
- a seventh gate formed on the gate oxide layer and spanned over the eighth doped region and the ninth doped region, wherein the seventh gate is connected with the first word line;
- an eighth gate formed on the gate oxide layer and spanned over the ninth doped region and the tenth doped region, wherein the eighth gate is connected with the first antifuse control line;
- a ninth gate formed on the gate oxide layer and spanned over the tenth doped region and the eleventh doped region, wherein the ninth gate is connected with the first isolation control line;
- a tenth gate formed on the gate oxide layer and spanned over the fourteenth doped region and the thirteenth doped region, wherein the tenth gate is connected with the second word line;
- an eleventh gate formed on the gate oxide layer and spanned over the thirteenth doped region and the twelfth doped region, wherein the eleventh gate is connected with the second antifuse control line;
- a twelfth gate formed on the gate oxide layer and spanned over the twelfth doped region and the eleventh doped region, wherein the twelfth gate is connected with the second isolation control line; and
- a second metal layer connected with the eighth doped region through a third via and connected with the fourteenth doped region through a fourth via, wherein the second metal layer is a second bit line.

* * * * *